(12) United States Patent
Lee et al.

(10) Patent No.: US 8,805,567 B2
(45) Date of Patent: Aug. 12, 2014

(54) METHOD OF CONTROLLING SEMICONDUCTOR PROCESS DISTRIBUTION

(75) Inventors: Ho-ki Lee, Anyang-si (KR); Kye-hyun Baek, Suwon-si (KR); Young-cheul Lee, Suwon-si (KR); Gyung-jin Min, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 375 days.

(21) Appl. No.: 13/241,575

(22) Filed: Sep. 23, 2011

(65) Prior Publication Data

US 2012/0150330 A1 Jun. 14, 2012

(30) Foreign Application Priority Data

Dec. 9, 2010 (KR) .................. 10-2010-0125656

(51) Int. Cl.
*G06F 19/00* (2011.01)
*G05B 21/00* (2006.01)
*H01L 21/67* (2006.01)

(52) U.S. Cl.
CPC ...... *G05B 21/00* (2013.01); *G05B 2219/32187* (2013.01); *G05B 2219/45031* (2013.01); *H01L 21/67253* (2013.01)
USPC ........... 700/121; 700/108; 700/109; 700/110; 702/181; 702/182

(58) Field of Classification Search
CPC ........... G05B 2219/32187; G05B 2219/45031; G05B 21/00; H01L 21/67253

USPC ................ 700/108–110, 121; 702/181, 182
See application file for complete search history.

(56) References Cited

U.S. PATENT DOCUMENTS

| | | | |
|---|---|---|---|
| 5,444,637 A * | 8/1995 | Smesny et al. | 702/127 |
| 6,652,710 B2 | 11/2003 | Cruse | |
| 6,680,523 B2 * | 1/2004 | Schober et al. | 257/620 |
| 7,974,801 B2 * | 7/2011 | Good | 702/81 |
| 8,108,060 B2 * | 1/2012 | Tsen et al. | 700/108 |
| 8,145,337 B2 * | 3/2012 | Lin et al. | 700/108 |
| 2002/0117735 A1 * | 8/2002 | Schober et al. | 257/620 |
| 2007/0222979 A1 * | 9/2007 | Van Der Laan et al. | 356/243.1 |
| 2008/0038675 A1 * | 2/2008 | Nagasaka | 430/322 |
| 2009/0228129 A1 * | 9/2009 | Moyne et al. | 700/102 |
| 2009/0276174 A1 * | 11/2009 | Good | 702/81 |
| 2012/0150330 A1 * | 6/2012 | Lee et al. | 700/104 |

FOREIGN PATENT DOCUMENTS

| | | |
|---|---|---|
| JP | 2001-015398 | 1/2001 |
| KR | 1020100025249 | 3/2010 |

* cited by examiner

*Primary Examiner* — Michael D Masinick
(74) *Attorney, Agent, or Firm* — F. Chau & Associates, LLC

(57) ABSTRACT

A method of controlling process distribution of a semiconductor process includes receiving process distribution data representing the process distribution of the semiconductor process, receiving a parameter related to the process distribution, generating a virtual metrology model corresponding to the process distribution based on a relationship between the process distribution data and the parameter, and modifying a process variable affecting the process distribution based on the virtual metrology model.

22 Claims, 8 Drawing Sheets

METHOD OF CONTROLLING SEMICONDUCTOR PROCESS DISTRIBUTION

CROSS-REFERENCE TO RELATED APPLICATIONS

This application claims priority under 35 U.S.C. §119 to Korean Patent Application No. 10-2010-0125656, filed on Dec. 9, 2010, the disclosure of which is incorporated by reference herein in its entirety.

BACKGROUND

1. Technical Field

Exemplary embodiments of the inventive concept relate to a semiconductor process, and more particularly, to a method of controlling semiconductor process distribution.

2. Discussion of the Related Art

A semiconductor process may be classified as a deposition process, an ion implantation process, a photolithography process, or an etching process. A semiconductor device is manufactured by performing the above-described semiconductor processes on a single semiconductor wafer multiple times.

The process capability of a semiconductor wafer processing apparatus may vary due to various factors. When the process capability of the semiconductor wafer processing apparatus changes, poor or inconsistent process distribution may occur. As process distribution changes, the distribution of a process result value that is used to monitor a semiconductor process also changes, which may result in inconsistencies during the semiconductor process.

SUMMARY

Exemplary embodiments of the inventive concept provide a method of controlling semiconductor process distribution that is used to control process distribution with respect to a semiconductor process according to a semiconductor wafer processing apparatus.

According to an exemplary embodiment of the inventive concept, a method of controlling semiconductor process distribution includes obtaining process distribution regarding a semiconductor process, obtaining a parameter related to the process distribution, deriving a virtual metrology model regarding process distribution of the semiconductor process by statistically analyzing the process distribution and the parameter, and correcting the process distribution by modifying a process variable related to the process distribution according to the virtual metrology model.

The semiconductor process may be an etching process for etching a material layer formed on the semiconductor wafer to form a material layer pattern.

Process distribution may be obtained from at least one selected from the group consisting of a critical dimension difference between the material layer patterns of a central area and a corner area of the semiconductor wafer, a range of the critical dimension difference between the material layer patterns of the central area and the corner area of the semiconductor wafer, standard deviation of the critical dimension difference between the material layer patterns of the central area and the corner area of the semiconductor wafer, and a thickness difference between the material layer patterns of the central area and the corner area of the semiconductor wafer.

The parameter may be obtained by sensors of the semiconductor wafer processing apparatus for performing a semiconductor process.

The sensor may be at least one selected from the group consisting of a photosensor that may monitor a polluted state of a chamber or a plasma in the semiconductor wafer processing apparatus, a temperature sensor for detecting a temperature of the chamber, and a gas analyzing sensor for analyzing reactive gas generated by the chamber.

The parameter may be obtained from an apparatus variable value that is set in the process controller of the semiconductor wafer processing apparatus for performing a semiconductor process. An apparatus variable value that is set in the process controller may be at least one selected from the group consisting of an amount of gas supplied to the chamber of the semiconductor wafer processing apparatus, gas rates of a plurality of gases supplied to the chamber, an RF power value applied to a susceptor included in the chamber, a temperature of each part of the chamber, and a pressure of the chamber.

A process variable, which is a variable affecting the process distribution of the semiconductor process, may be at least one selected from the group consisting of an amount of gas supplied to the chamber of the semiconductor wafer processing apparatus, gas rates of a plurality of gases supplied to the chamber, an RF power value applied to the susceptor included in the chamber, a temperature of each part of the chamber, and a pressure of the chamber.

A statistical analysis method may be performed by using a partial least squares (PLS) method. After the process distribution is corrected, process distribution of each semiconductor wafer regarding the semiconductor process is measured, it is determined whether the process distribution of each semiconductor wafer is satisfactory, and the virtual metrology model is modified when the process distribution of each semiconductor wafer is not satisfactory.

According to an exemplary embodiment of the inventive concept, a method of controlling semiconductor process distribution includes obtaining process distribution regarding a semiconductor process, obtaining a parameter related to the process distribution, deriving a virtual metrology model regarding process distribution of the semiconductor process by statistically analyzing the process distribution and the parameter, selecting an optimized process variable related to the process distribution, predicting process distribution of each semiconductor wafer by using the virtual metrology model, and correcting the process distribution by modifying the process variable related to the process distribution according to the predicted process distribution.

The parameter may be obtained from at least one selected from the group consisting of values obtained from a plurality of sensors of a semiconductor wafer processing apparatus for performing the semiconductor process and an apparatus variable value set in a process controller of the semiconductor wafer processing apparatus.

An optimized process variable may be selected using a virtual metrology model.

After the process distribution is corrected, process distribution of each semiconductor wafer regarding the semiconductor process is measured, it is determined whether the process distribution of each semiconductor wafer is satisfactory, and the virtual metrology model is modified when the process distribution of each semiconductor wafer is not satisfactory.

According to an exemplary embodiment of the inventive concept, a method of controlling semiconductor process distribution includes obtaining process distribution according to an etching process of a semiconductor wafer, obtaining a parameter from a semiconductor wafer etching apparatus in connection with the process distribution, deriving a virtual metrology model regarding the process distribution of the etching process of the semiconductor wafer by statistically analyzing the process distribution and the parameter, and correcting the process distribution by modifying a process variable related to the process distribution according to the virtual metrology model.

The parameter may be obtained from at least one selected from the group consisting of values obtained from a plurality of sensors of the semiconductor wafer etching apparatus and an apparatus variable value set in a process controller of the semiconductor wafer processing apparatus.

The sensor may be at least one selected from the group consisting of a photosensor that may monitor a polluted state of a chamber or a plasma in the semiconductor wafer etching apparatus, a temperature sensor for detecting a temperature of the chamber, and a gas analyzing sensor for analyzing reactive gas generated from the chamber.

The apparatus variable value set in a process controller may be at least one selected from the group consisting of an amount of gas supplied to the chamber of the semiconductor wafer processing apparatus, gas rates of a plurality of gases supplied to the chamber, an RF power value applied to the susceptor included in the chamber, a temperature of each part of the chamber, and a pressure of the chamber.

The etching process is performed to form a material layer pattern by etching a material layer formed on the semiconductor wafer, and the process distribution may be obtained from at least one selected from the group consisting of the critical dimension difference between material layer patterns of a central area and a corner area of the semiconductor wafer, a range of the critical dimension difference between the material layer patterns of the central area and the corner area of the semiconductor wafer, standard deviation of the critical dimension difference between the material layer patterns of the central area and the corner area of the semiconductor wafer, and a thickness difference between the material layer patterns of the central area and the corner area of the semiconductor wafer.

A process variable, which is a variable affecting the process distribution of the semiconductor process, may be at least one selected from the group consisting of an amount of gas supplied to the chamber of the semiconductor wafer etching apparatus, gas rates of a plurality of gases supplied to the chamber, an RF power value applied to the susceptor included in the chamber, a temperature of each part of the chamber, and a pressure of the chamber.

A statistical analysis method may be performed by using a partial least squares (PLS) method.

After the process distribution is corrected, process distribution of each semiconductor wafer regarding the semiconductor etching process is measured, it is determined whether the process distribution of each semiconductor wafer is satisfactory, and the virtual metrology model is modified when the process distribution of each semiconductor wafer is not satisfactory.

According to an exemplary embodiment of the inventive concept, a method of controlling process distribution of a semiconductor process includes receiving process distribution data representing the process distribution of the semiconductor process, receiving a parameter related to the process distribution, generating a virtual metrology model corresponding to the process distribution based on a relationship between the process distribution data and the parameter, and modifying a process variable affecting the process distribution based on the virtual metrology model.

According to an exemplary embodiment of the inventive concept, a method of controlling process distribution of an etching process includes receiving process distribution data representing the process distribution of the etching process, wherein the etching process is performed on a semiconductor wafer by a semiconductor wafer etching apparatus, receiving a parameter related to the process distribution from the semiconductor wafer etching apparatus, generating a virtual metrology model corresponding to the process distribution of the etching process based on a relationship between the process distribution data and the parameter, and modifying a process variable affecting the process distribution based on the virtual metrology model.

According to an exemplary embodiment of the inventive concept, a system for controlling process distribution of a semiconductor process includes a semiconductor wafer processing apparatus configured to perform the semiconductor process, and a semiconductor process controlling apparatus comprising an input circuit configured to receive process distribution data representing the process distribution of the semiconductor process and a parameter related to the process distribution, and a processor configured to generate a virtual metrology model corresponding to the process distribution based on a relationship between the process distribution data and the parameter, and modify a process variable affecting the process distribution based on the virtual metrology model.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
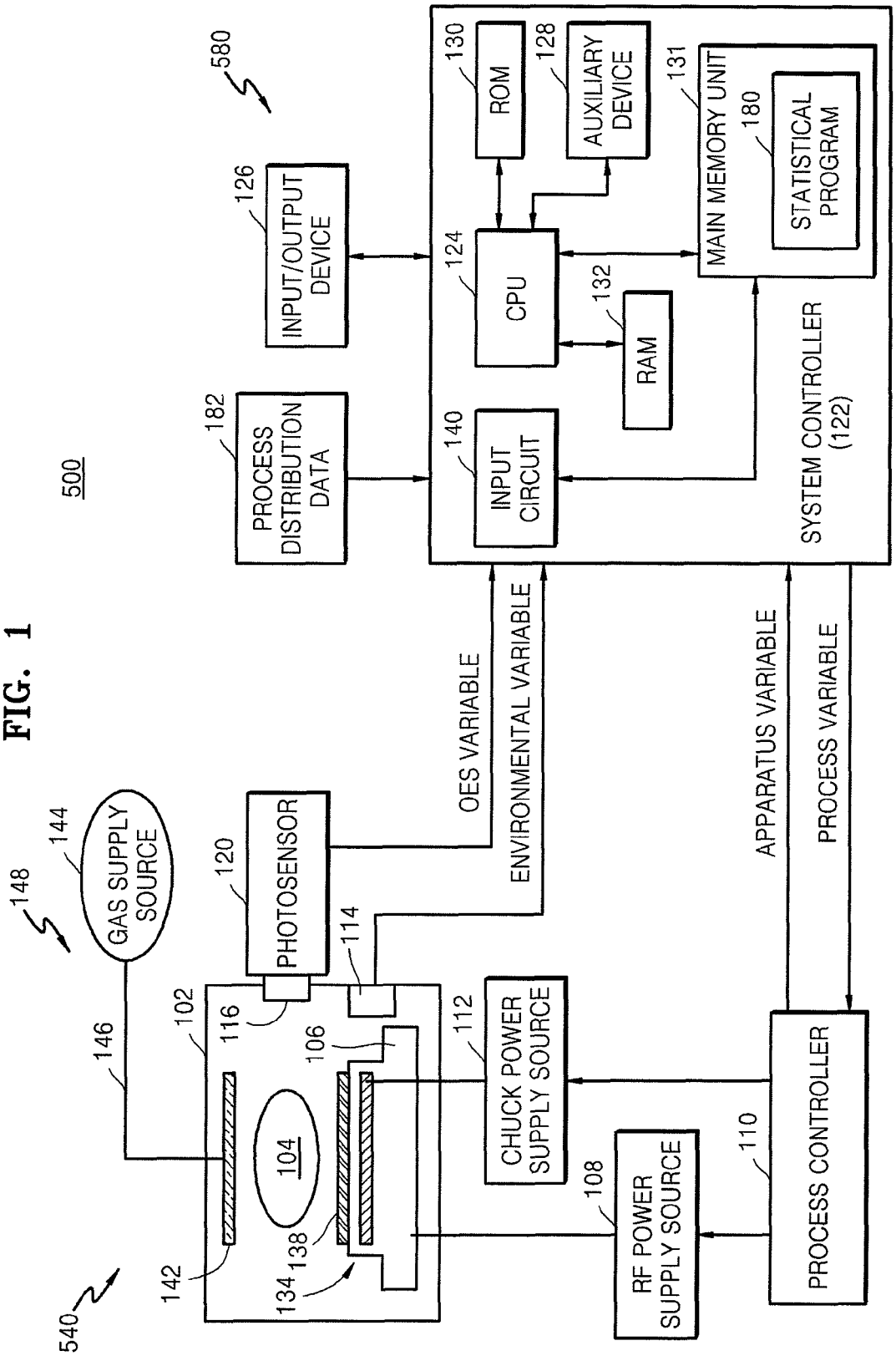
FIG. 1 is a block diagram illustrating a semiconductor process distribution controlling system that may be used for a method of controlling semiconductor process distribution, according to an exemplary embodiment of the inventive concept.

Exemplary embodiments of the inventive concept will be described more fully hereinafter with reference to the accompanying drawings. Like reference numerals may refer to like elements throughout the accompanying drawings.

As will be appreciated by one skilled in the art, aspects of the inventive concept may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

In a method of controlling semiconductor process distribution, according to an exemplary embodiment of the inventive concept, process distribution may include distribution of a process result value in a semiconductor wafer and distribution of a process result value between semiconductor wafers.

The method of controlling semiconductor process distribution, according to an exemplary embodiment of the inventive concept, may be used in a semiconductor wafer processing apparatus including, for example, a thin layer deposition apparatus, an ion implantation apparatus, a photolithography apparatus, or an etching apparatus.

FIG. 1 is a block diagram illustrating a semiconductor process distribution controlling system 500 that may be used for a method of controlling semiconductor process distribution according to an exemplary embodiment of the inventive concept. FIG. 1 illustrates controlling the semiconductor process distribution when using an etching apparatus.

The semiconductor process distribution controlling system 500 is used to perform a method of controlling semiconductor process distribution. The semiconductor process distribution system 500 includes a semiconductor wafer processing apparatus 540 and a semiconductor process controlling apparatus 580.

The semiconductor wafer processing apparatus 540 shown in FIG. 1 may be an etching apparatus, however the semiconductor wafer processing apparatus 540 is not limited thereto. For example, the semiconductor wafer processing apparatus 540 may be a deposition apparatus, an ion implantation apparatus, or a photolithography apparatus. The semiconductor wafer processing apparatus 540 shown in FIG. 1 includes a susceptor 106 in a chamber 102 (e.g., a reaction chamber) supporting a semiconductor wafer 138, a radio frequency (RF) power supply source 108, a chuck power supply source 112, a reactive gas supply assembly 148, and a process controller 110.

The susceptor 106 includes an electrostatic chuck 134 for receiving the semiconductor wafer 138 on a supporting surface. The electrostatic chuck 134 receives power from the chuck power supply source 112. The susceptor 106 may be, for example, a cathode for generating plasma 104. The cathode is coupled to the RF power supply source 108. The plasma 104 is generated by supplying RF power to reactive gas.

The reactive gas supply assembly 148 includes a gas supply source 144 for supplying reactive gas to the chamber 102 via a gas supply pipe 146 and a manifold 142. The RF power is supplied to the susceptor 106 (e.g., a cathode), and a wall of the chamber 102 is grounded. An electric field between the wall of the chamber 102 and the susceptor 106 (e.g., a cathode) forms the plasma 104 in the chamber 102.

A voltage applied to the electrostatic chuck 134 and an RF power level are controlled by the process controller 110. The plasma 104 is used to perform plasma-enhanced dry etching on a surface of the semiconductor wafer 138. Photoemission of the plasma 104 generated in the chamber 102 is detected by a photodetector (e.g., photosensor 120) via a transparent window 116. The photosensor 120 is disposed in front of the transparent window 116 outside of the chamber 102. The photosensor 120 may be configured, for example, as a band-pass photodetector or a photoelectric power supply pipe using a monochromator in order to select a specific light wavelength.

At least one environmental sensor 114 may be connected to the chamber 102. An environmental sensor 114 may be, for example, a temperature sensor for detecting a temperature of the chamber 102, a pressure sensor for detecting a pressure of the chamber 102, or a gas analyzing sensor for analyzing reactive gas generated by the chamber 102.

The semiconductor process controlling apparatus 580 includes a system controller 122 that includes a central processing unit (CPU) 124, an auxiliary device or an auxiliary circuit 128, a read-only memory (ROM) 130, a random-access memory (RAM) 132, a main memory unit 131, and an input/output device 126. The main memory unit 131 may be, for example, a hard disk, and the RAM 132 may be, for example, an auxiliary memory device. The auxiliary device 128 may include, for example, a power supply source, a clock circuit generator, a bus controller, or a cache memory. Accordingly, the system controller 122 may be a computer.

Process distribution data (e.g., process distribution value (s)) 182 related to the semiconductor process performed in the semiconductor wafer processing apparatus 540 is input to the semiconductor process controlling apparatus 580. The semiconductor process controlling apparatus 580 includes an input circuit 140 that may convert a parameter input from the semiconductor wafer processing apparatus 540 into an electrical signal. The main memory unit 131 may include a statistical program 180 for performing a statistical analysis of the relationship between the parameter and the process distribution data.

The parameter input from the semiconductor wafer processing apparatus 540 to the semiconductor process controlling apparatus 580 may be a variable (e.g., a variable value) input from the photosensor 120 or the environmental sensor 114, or an apparatus variable value input from the process controller 110.

For example, in the semiconductor wafer processing apparatus 540, the photosensor 120 may detect light energy via the transparent window 116. For example, a light energy value (e.g., an optical emission spectroscopy (OES) variable) may be input to the system controller 122 of the semiconductor process controlling apparatus 580 as one parameter for controlling semiconductor process distribution.

The photosensor 120 of the semiconductor wafer processing apparatus 540 may convert light energy into an electrical signal. The electrical signal may be input to the input circuit 140 of the system controller 122. The input circuit 140 may synchronize and digitize a parameter (e.g., a parameter value) input to the system controller 122.

A parameter for controlling semiconductor process distribution may be an environmental variable. For example, an environmental variable may be input from the environmental sensor 114 in the chamber 102 of the semiconductor wafer processing apparatus 540 to the system controller 122. The environmental variable may be, for example, a temperature of the chamber 102, a pressure of the chamber 102, or an amount of reactive gas generated by the chamber 102. When the environmental variable is converted into an electrical signal, the environmental variable may be input to the input circuit 140 to be processed.

An apparatus variable value may be input from the process controller 110 of the semiconductor wafer processing apparatus 540 to the system controller 122 of the semiconductor process controlling apparatus 580. The apparatus variable value is set by the process controller 110, and may be, for example, an amount of gas supplied to the chamber 102, gas rates of a plurality of gases supplied to the chamber 102, an RF power value applied to the susceptor 106 included in the chamber 102, a temperature of each part of the chamber 102, or a pressure of the chamber 102. When an apparatus variable value is converted into an electrical signal, the apparatus variable value may be input to the input circuit 140 to be processed.

The semiconductor process controlling apparatus 580 performs a statistical analysis using the statistical program 180 stored in the main memory unit 131 based on a correlation between previously input process distribution data and a parameter input from the semiconductor wafer processing apparatus 540. A virtual metrology model regarding process distribution of a semiconductor process is generated using the statistical analysis, and the process distribution is adjusted by modifying a process variable related to the process distribution.

The process variable is a variable affecting the process distribution of the semiconductor process. The process variable may be, for example, an amount of gas supplied to the chamber 102 of the semiconductor wafer processing apparatus 540, gas rates of a plurality of gases supplied to the chamber 102, an RF power value applied to the susceptor 106 included in the chamber 102, a temperature of each part of the chamber 102, or a pressure of the chamber 102.

The statistical analysis regarding a correlation between the previously input process distribution data and the parameter input from the semiconductor wafer processing apparatus 540 may be performed using, for example, a partial least squares (PLS) technique.

The PLS technique may be used to perform statistical modeling using a correlation between a parameter X and a quality variable Y (e.g., process distribution). Utilization of the PLS method may result in a statistical analysis having high prediction capability when the correlation between the parameter X and the quality variable Y is high, and high reliability when process noise is present. For example, the PLS technique may be used to perform modeling using a correlation between a parameter X and a quality variable Y as described in equations (1) and (2):

$$X = \sum_{a}^{A} t_a p_a^T + E_A \quad (1)$$

$$Y = \sum_{a}^{A} u_a q_a^T + F_A \quad (2)$$

In equations (1) and (2), $t_a$ denotes an a-th score vector representing a record in a reduced space of a parameter X considering a quality variable Y, and $u_a$ denotes an a-th score vector representing a record in a reduced space of a quality variable Y considering a parameter X. Further, $p_a$ denotes a loading vector, which is an eigenvector of a covariance matrix $X^T X$, $E_A$ denotes a residual matrix, and $q_a$ and $F_A$ in equation (2) are similar to $p_a$ and $E_A$ in equation (1), respectively. In addition, the PLS technique may perform modeling with a regression coefficient using an inner relation between the score vectors of the parameter X and the quality variable Y.

Hereinafter, an example of a method of controlling semiconductor process distribution according to an exemplary embodiment of the inventive concept will be described.

Figure 2:
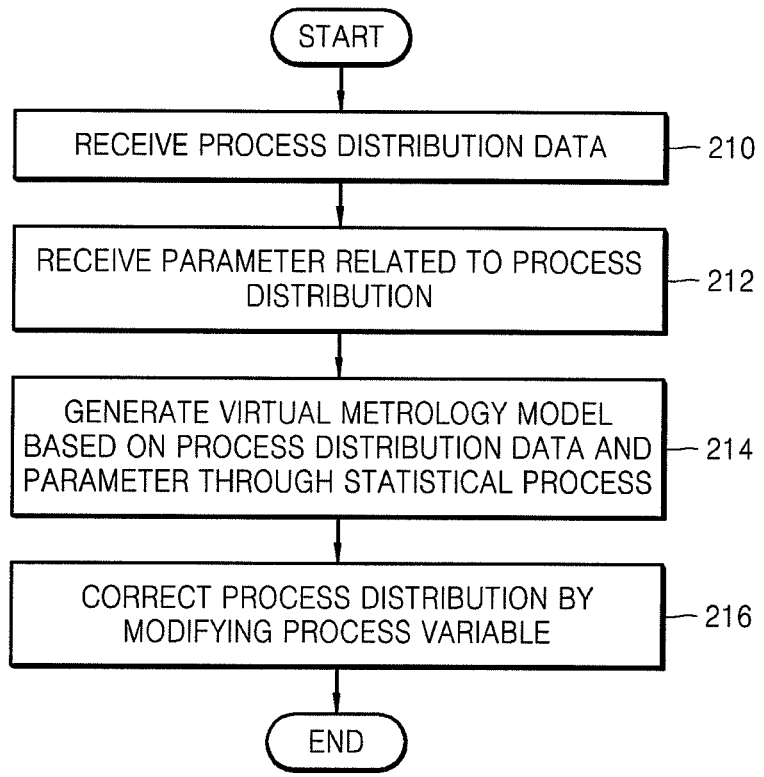
FIG. 2 is a flowchart illustrating a method of controlling semiconductor process distribution, according to an exemplary embodiment of the inventive concept.
Figure 3:
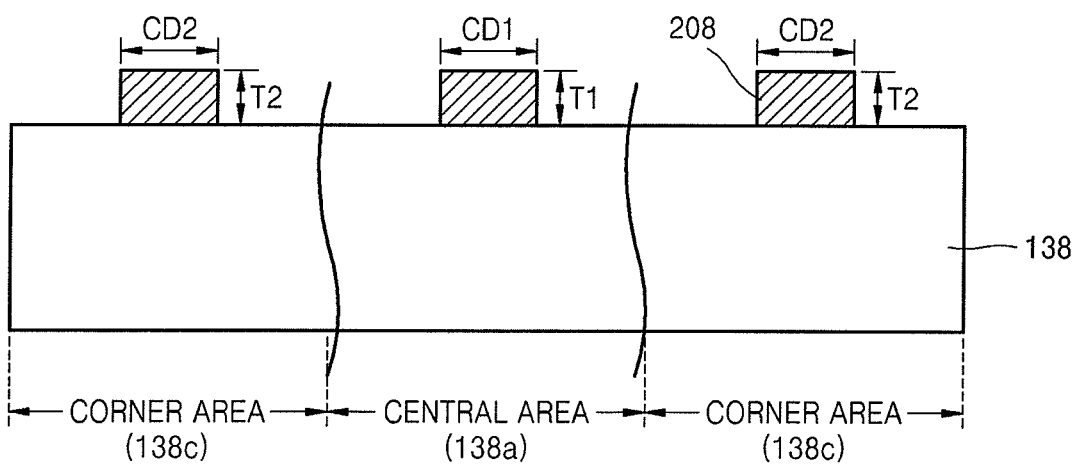
FIG. 3 is a cross-sectional view of a semiconductor wafer during a method of controlling semiconductor process distribution, according to an exemplary embodiment of the inventive concept.
Figure 4:
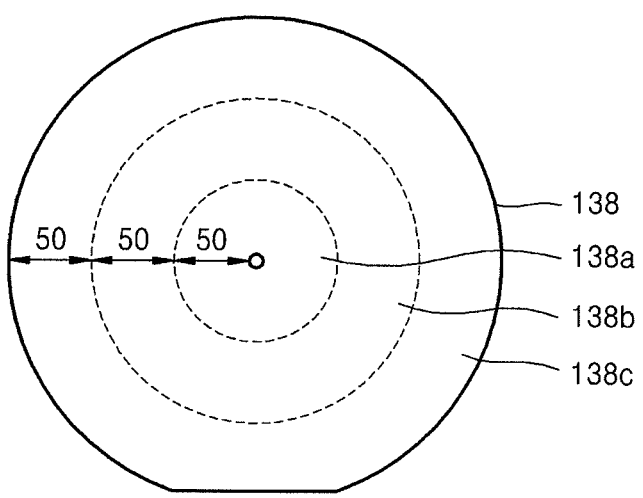
FIG. 4 is a plane view of a semiconductor wafer during a method of controlling semiconductor process distribution, according to an exemplary embodiment of the inventive concept.

FIG. 2 is a flowchart showing a method of controlling semiconductor process distribution according to an exemplary embodiment of the inventive concept. FIG. 3 is a cross-sectional view of the semiconductor wafer 138 during the method of controlling semiconductor process distribution according to an exemplary embodiment of the inventive concept. FIG. 4 is a plane view of the semiconductor wafer 138 during the method of controlling semiconductor process distribution according to an exemplary embodiment of the inventive concept.

Referring to FIG. 2, process distribution data corresponding to a semiconductor process is obtained (operation 210). The process distribution data may be obtained using characteristic values that are used to monitor a semiconductor process when performing the semiconductor process on a plurality of semiconductor wafers.

For example, the semiconductor process may be an etching process performed using the semiconductor wafer processing apparatus 540 illustrated in FIG. 1. That is, the semiconductor process may be an etching process for etching a material layer formed on the semiconductor wafer 138 to form a material layer pattern 208, as illustrated in FIG. 3.

Referring to FIG. 4, the semiconductor wafer 138 may by divided into a central area 138a, an intermediate area 138b, and a corner area 138c. For example, when a radius of the semiconductor wafer 138 is about 150 mm, the width of each of the central area 138a, the intermediate area 138b, and the corner area 138c may be about 50 mm.

Referring to FIGS. 3 and 4, when the semiconductor process is an etching process, process distribution data may be obtained from, for example, a critical dimension difference CD1-CD2 between the material layer patterns 208 of the central area 138a and the corner area 138c of the semiconductor wafer 138, a range of the critical dimension difference CD1-CD2 between the material layer patterns 208 of the central area 138a and the corner area 138c of the semiconductor wafer 138, standard deviation of the critical dimension difference CD1-CD2 between the material layer patterns 208 of the central area 138a and the corner area 138c of the semiconductor wafer 138, or a thickness difference T1-T2 between the material layer patterns 208 of the central area 138a and the corner area 138c of the semiconductor wafer 138.

In addition to an etching process, the semiconductor process may be, for example, a thin film deposition process, an ion implantation process, or a photolithography process. Process distribution regarding each semiconductor process may be obtained from characteristic values that may be used to monitor each process.

Referring again to FIG. 2, a parameter related to the process distribution is obtained (operation 212). The parameter is a variable that is directly or indirectly related to the process distribution. The parameter may be obtained by sensors of the semiconductor wafer processing apparatus 540.

For example, when the semiconductor process is an etching process, similar to the process performed by the semiconductor process distribution controlling system 500 of FIG. 1, the sensor may be the photosensor 120 or the environmental sensor 114. The photosensor 120 may monitor, for example, a polluted state of the chamber 102 or the plasma 104 in the semiconductor wafer processing apparatus 540. The environmental sensor 114 may be, for example, a temperature sensor detecting a temperature of the chamber 102, or a gas analyzing sensor analyzing reactive gas generated from the chamber 102.

A parameter may be obtained from an apparatus variable value that is set in the process controller 110 of the semiconductor wafer processing apparatus 540.

For example, when the semiconductor process is an etching process similar to the process performed by the semiconductor process distribution controlling system 500 of FIG. 1, the apparatus variable value that is set in the process controller 110 may be, for example, an amount of gas supplied to the chamber 102 of the semiconductor wafer processing apparatus 540, gas rates of a plurality of gases supplied to the chamber 102, an RF power value applied to the susceptor 106 included in the chamber 102, a temperature of each part of the chamber 102, or a pressure of the chamber 102.

A virtual metrology model regarding the process distribution of a semiconductor process is generated by statistically analyzing the process distribution and the parameter (operation 214). The statistical analysis for generating the virtual metrology model may be performed using, for example, the PLS technique as described above. Alternatively, the statistical analysis may use various other techniques as understood by those of ordinary skill in the art.

The process distribution is corrected by modifying a process variable related to the process distribution according to the virtual metrology model obtained through the statistical analysis (operation 216).

The parameter is a variable that is directly or indirectly related to the process distribution as described above. For example, the parameter may be obtained by sensors of the semiconductor wafer processing apparatus 540, or may be obtained from the apparatus variable value that is set in the process controller 110 of the semiconductor wafer processing apparatus 540.

Thus, the process variable is a variable that is directly related to the process distribution. For example, when the semiconductor process is an etching process similar to the process performed by the semiconductor process distribution controlling system 500 of FIG. 1, the process variable, which is a variable affecting the process distribution of the semiconductor process, may be, for example, an amount of gas supplied to the chamber 102 of the semiconductor wafer processing apparatus 540, gas rates of a plurality of gases supplied to the chamber 102, an RF power value applied to the susceptor 106 included in the chamber 102, a temperature of each part of the chamber 102, or a pressure of the chamber 102. The process distribution is controlled by adjusting at least one of the above-described process variables.

Figure 5:
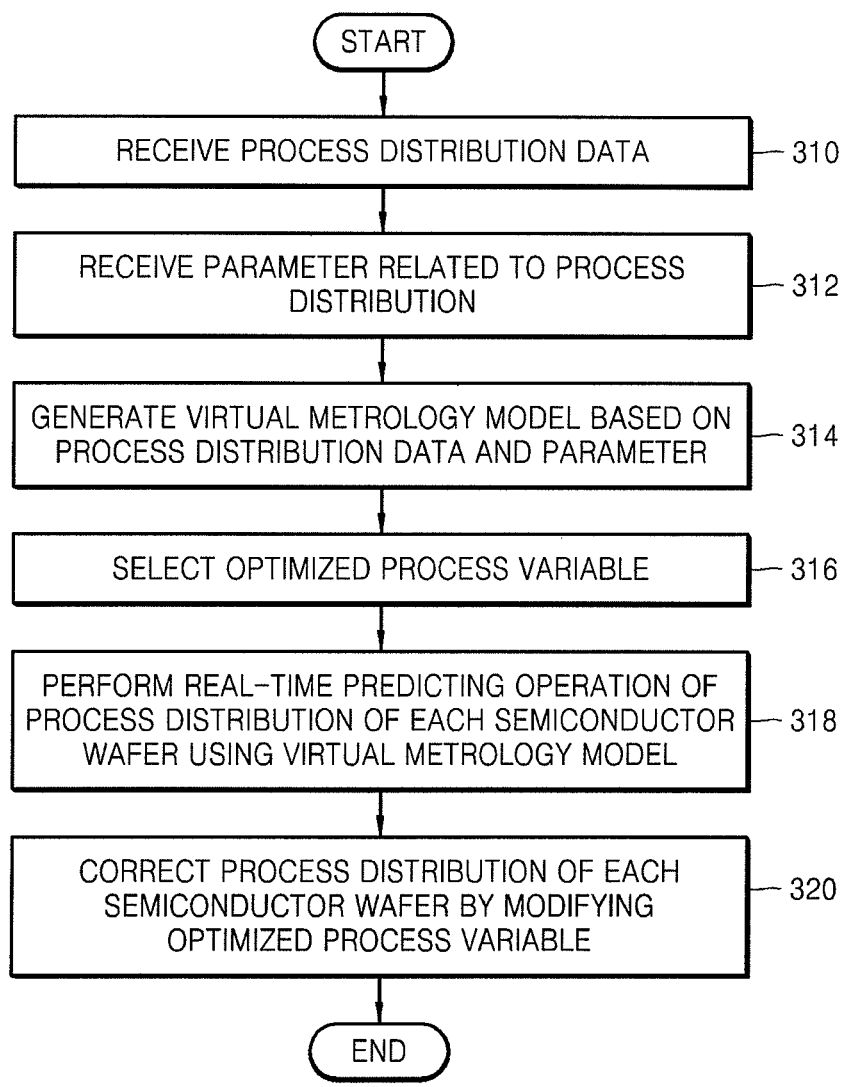
FIG. 5 is a flowchart of a method of controlling semiconductor process distribution, according to an exemplary embodiment of the inventive concept.

FIG. 5 is a flowchart of a method of controlling semiconductor process distribution according to an exemplary embodiment of the inventive concept.

Referring to FIG. 5, the method of controlling the semiconductor process distribution is similar to the method shown in FIG. 2, except for the addition of an operation selecting an optimized process variable (operation 316) and an operation predicting process distribution of each semiconductor wafer in real-time using a virtual metrology model (operation 318).

For example, process distribution data regarding a semiconductor process is obtained (operation 310). Operation 310 of FIG. 5 corresponds to operation 210 of FIG. 2, and thus a repeated description thereof will be omitted. Subsequently, a parameter related to the process distribution is obtained (operation 312). Operation 312 of FIG. 5 corresponds to operation 212 of FIG. 2, and thus a repeated description thereof will be omitted.

A virtual metrology model based on the process distribution of a semiconductor process is generated by statistically analyzing the process distribution and the parameter (operation 314). Operation 314 of FIG. 5 corresponds to operation 214 of FIG. 2, and thus a repeated description thereof will be omitted.

An optimized process variable related to the process distribution is selected (operation 316). As described above, when the semiconductor process is an etching process similar to the process performed by the semiconductor process distribution controlling system 500 of FIG. 1, the process variable, which is a variable affecting the process distribution of the semiconductor process, may be, for example, an amount of gas supplied to the chamber 102 of the semiconductor wafer processing apparatus 540, gas rates of a plurality of gases supplied to the chamber 102, an RF power value applied to the susceptor 106 included in the chamber 102, a temperature of each part of the chamber 102, or a pressure of the chamber 102.

An effective process variable that is related to the process distribution and may modify the process distribution may be selected from among the above-described process variables.

A real-time predicting operation regarding the process distribution of each semiconductor wafer is performed using the virtual metrology model while performing the semiconductor process (operation 318). For example, the process distribution is predicted in real-time using the virtual metrology model generated by the previous operation while performing the semiconductor process. The process distribution may be modified (e.g., reduced) in real-time by monitoring the process distribution of the semiconductor process in real-time.

The process distribution is corrected by modifying the optimized process variable related to the process distribution in real-time (operation 320). For example, the process distribution is corrected by modifying the optimized process variable in real-time while performing the semiconductor process.

Figure 6:
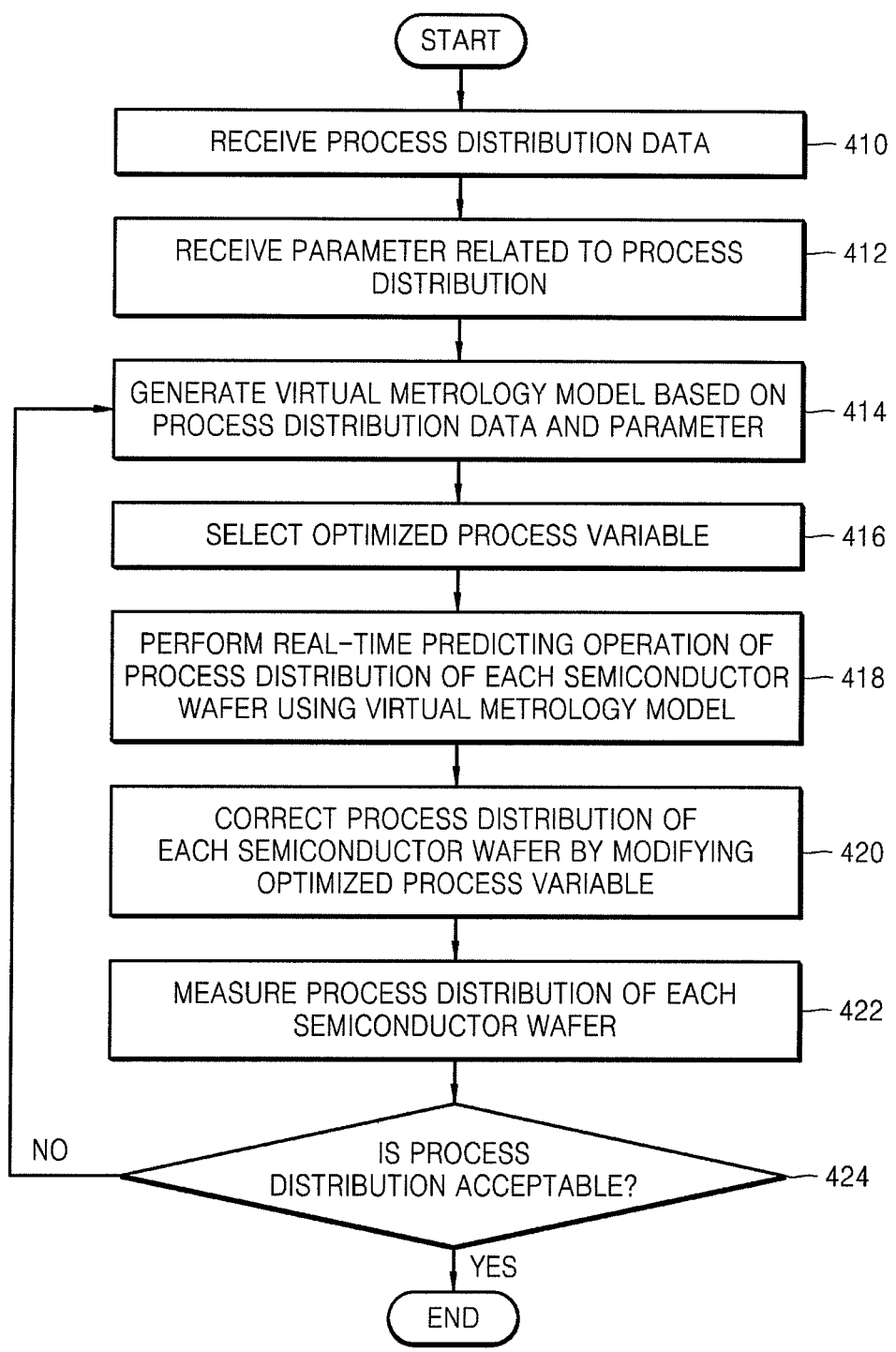
FIG. 6 is a flowchart of a method of controlling semiconductor process distribution, according to an exemplary embodiment of the inventive concept.

FIG. 6 is a flowchart of a method of controlling semiconductor process distribution according to an exemplary embodiment of the inventive concept.

Referring to FIG. 6, the method of controlling the semiconductor process distribution is similar to the method of FIG. 5, except for an operation measuring process distribution of each semiconductor wafer (operation 422) and an operation determining whether the measured process distribution is acceptable (operation 424).

In FIG. 6, process distribution data regarding a semiconductor process is obtained (operation 410). Operation 410 corresponds to operation 210 of FIG. 2 and operation 310 of FIG. 5, and thus a repeated description thereof will be omitted. A parameter related to the process distribution is obtained (operation 412). Operation 412 corresponds to operation 212 of FIG. 2 and operation 312 of FIG. 5, and thus a repeated description thereof will be omitted.

A virtual metrology model based on the process distribution of a semiconductor process is generated by statistically analyzing the process distribution and the parameter (operation 414). Operation 414 corresponds to operation 214 of FIG. 2 and operation 314 of FIG. 5, and thus a repeated description thereof will be omitted.

An optimized process variable related to the process distribution is selected (operation 416). Operation 416 corresponds to operation 316 of FIG. 5, and thus a repeated description thereof will be omitted. A real-time predicting operation regarding the process distribution of each semiconductor wafer is performed using the virtual metrology model while performing the semiconductor process (operation 418). Operation 418 corresponds to operation 318 of FIG. 5, and thus a repeated description thereof will be omitted.

The process distribution is corrected by modifying the optimized process variable related to the process distribution in real-time (operation 420). Operation 420 corresponds to operation 320 of FIG. 5, and thus a repeated description thereof will be omitted.

The process distribution of each semiconductor wafer is measured (operation 422). For example, the process distribution is corrected by modifying the optimized process variable and measuring the process distribution again. The process distribution is measured in order to determine whether the modified process variable is acceptable.

It is then determined whether the measured process distribution within an acceptable range (operation 424). If the measured process distribution is within an acceptable range, the method of controlling the semiconductor process distribution is complete. If the measured process distribution is not within an acceptable range, a virtual metrology model based on the process distribution and the parameter is generated again. Thus, the virtual metrology model regarding the process distribution may be updated in real-time.

Hereinafter, an experimental example using a method of controlling semiconductor process distribution using a semiconductor wafer etching apparatus will be described.

For example, semiconductor process distribution when etching a semiconductor wafer using the semiconductor wafer processing apparatus 540 of FIG. 1 will be described.

Figure 7:
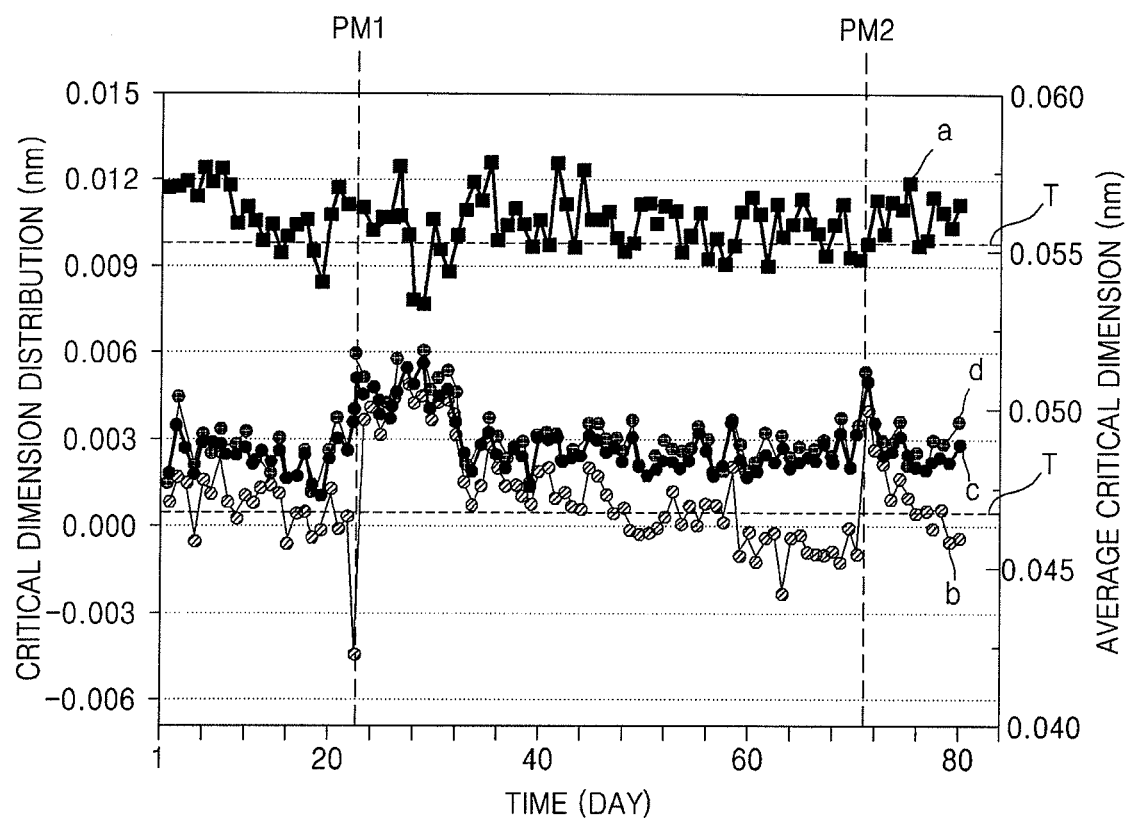
FIG. 7 is a graph showing semiconductor process distribution when etching a semiconductor wafer using the semiconductor wafer processing apparatus of FIG. 1, according to an exemplary embodiment of the inventive concept.

FIG. 7 is a graph showing semiconductor process distribution when etching a semiconductor wafer using the semiconductor wafer processing apparatus 540 of FIG. 1.

For example, FIG. 7 is a graph showing semiconductor process distribution when performing an etching process for forming a material layer pattern by etching a material layer formed on a semiconductor wafer. The X-axis represents time (e.g., a day). As described above, a left Y-axis represents a critical dimension difference between material layer patterns of a central area and a corner area of the semiconductor wafer, standard deviation of the critical dimension difference, and a range of the critical dimension difference, and a right Y-axis represents an average critical dimension.

As illustrated by plot 'a' in FIG. 7, process distribution regarding the average critical dimension shows a constant tendency on the basis of a target value T before and after performing first and second preventive maintenances PM1 and PM2 of a chamber.

Further, as illustrated by plots 'b', 'c', and 'd' in FIG. 7, process distribution regarding a critical dimension difference between material layer patterns of a central area and a corner area of a semiconductor wafer, standard deviation of a critical dimension, and a range of a critical dimension is inclined to one side based on a target value T, or changes before or after the first and second preventive maintenances PM1 and PM2.

For example, as illustrated by plot 'b' in FIG. 7, the process distribution regarding the critical dimension difference between the material layer patterns of the central area and the corner area of the semiconductor wafer is continuously decreased after the first preventive maintenance PM1 and is then increased after the second preventive maintenance PM2.

Thus, the process distribution regarding the critical dimension difference between the material layer patterns of the central area and the corner area of the semiconductor wafer changes because states of components of a semiconductor wafer etching apparatus change. For example, the process distribution regarding the critical dimension difference between the material layer patterns of the central area and the corner area of the semiconductor wafer changes because as a semiconductor process proceeds, polymers are non-uniformly deposited on an electrode of a chamber of the semiconductor wafer etching apparatus. As a result, plasma is generated non-uniformly.

Figure 8:
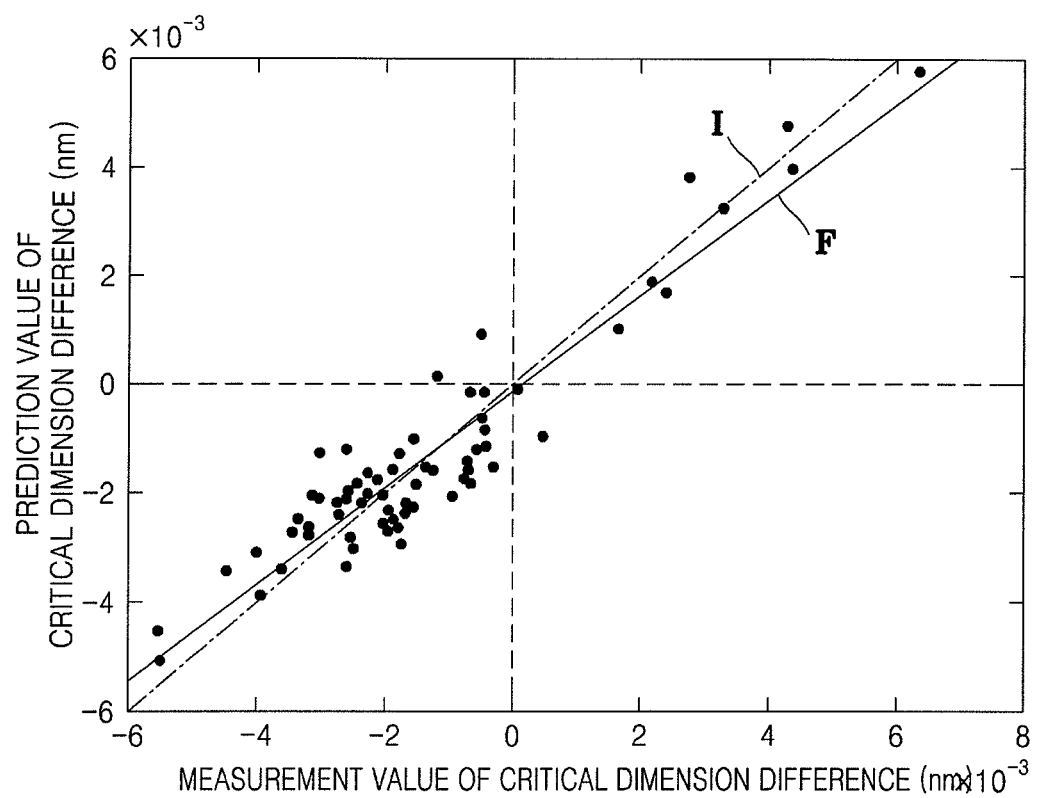
FIG. 8 is a graph illustrating the consistency of a virtual metrology model derived using a statistical analysis method during a method of controlling semiconductor process distribution, according to an exemplary embodiment of the inventive concept.

Referring to FIG. 8, the consistency between a measurement value and a prediction value when using PLS statistical analysis during the method of controlling semiconductor process distribution will be described.

FIG. 8 is a graph illustrating the consistency of a virtual metrology model generated using a statistical analysis method during a method of controlling semiconductor process distribution according to an exemplary embodiment of the inventive concept.

For example, FIG. 8 is a graph obtained by comparing a measurement value of an actual critical dimension difference between material layer patterns of a central area and a corner area of a semiconductor wafer. The measurement value is obtained when an etching process for forming the material layer pattern is performed by etching a material layer formed on the semiconductor wafer using the semiconductor wafer processing apparatus 540 illustrated in FIG. 1.

The graph illustrated in FIG. 8 uses values obtained by performing a semiconductor etching process for three months using the semiconductor wafer processing apparatus 540 illustrated in FIG. 1. The X-axis corresponds to a measurement value of a critical dimension difference between material layer patterns of a central area and a corner area of a semiconductor wafer, and the Y-axis is a prediction value of a critical dimension difference between the material layer patterns of the central area and the corner area of the semiconductor wafer. Plot I shows a case where the measurement value and the prediction value ideally match each other. Plot F shows a result of matching the measurement value and the prediction value when using the virtual metrology model.

As illustrated in FIG. 8, when a PLS statistical analysis method is used, a correlation coefficient that is close to 1 shows a high consistency. In the exemplary embodiment of the inventive concept, a correlation coefficient is about 0.89, which shows that consistency between the measurement value and the prediction value is high.

Figure 9:
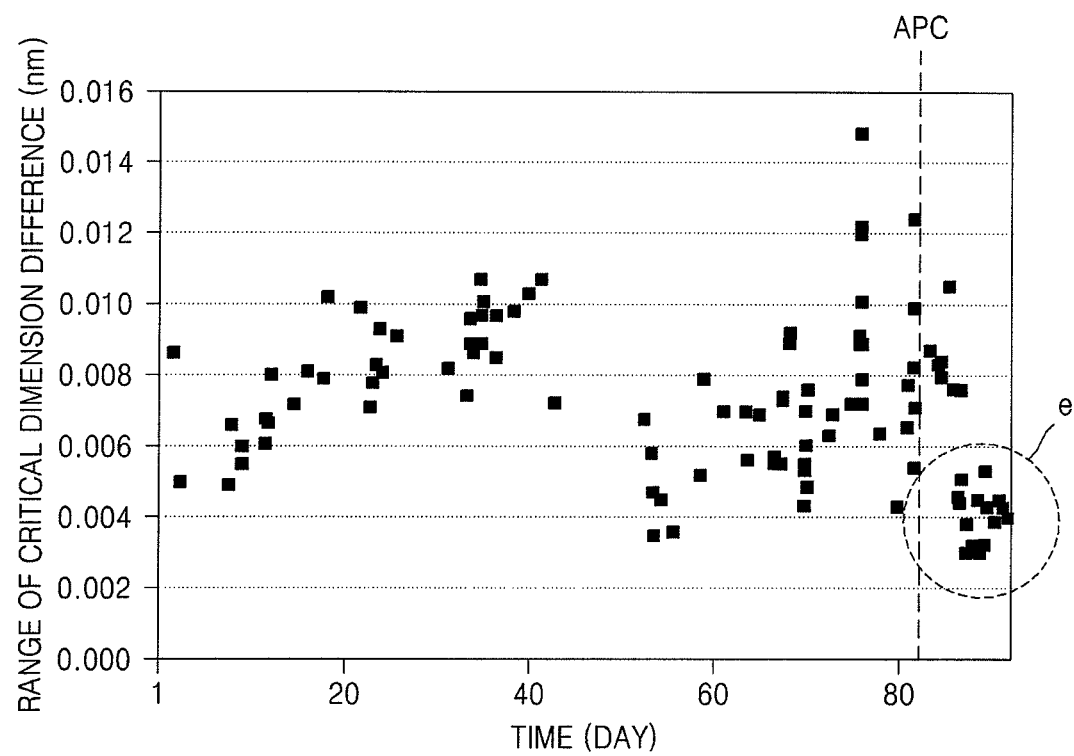
FIG. 9 is a graph illustrating a range of a critical dimension difference when a semiconductor process is performed using a method of controlling semiconductor process distribution, according to an exemplary embodiment of the inventive concept.

FIG. 9 is a graph illustrating a range of a critical dimension difference when a semiconductor process is performed using a method of controlling semiconductor process distribution according to an embodiment of the inventive concept.

For example, FIG. 9 is a graph illustrating semiconductor process distribution based on a range of a critical dimension difference when an etching process for forming a material layer pattern is performed by etching a material layer formed on a semiconductor wafer using the semiconductor wafer processing apparatus 540 illustrated in FIG. 1 (e.g., a semiconductor wafer etching apparatus). The X-axis represents time (e.g., a day). The Y-axis represents a range of a critical dimension difference between the material layer pattern of a central area and a corner area of a semiconductor wafer as described above.

As illustrated in FIG. 9, as the semiconductor wafer etching apparatus is used, the range of the critical dimension difference between the material layer patterns of the central area and the corner area of the semiconductor wafer increases. For example, as the semiconductor wafer etching apparatus is used, distribution regarding the range of the critical dimension difference between the material layer patterns of the central area and the corner area of the semiconductor wafer may not be acceptable.

However, when a semiconductor process is automatically adjusted using a method of controlling the semiconductor process distribution after a time denoted by 'APC' in FIG. 9, distribution regarding the range of the critical dimension difference between the material layer patterns of the central area and the corner area of the semiconductor wafer is improved, as illustrated by 'e' of FIG. 9.

Figure 10:
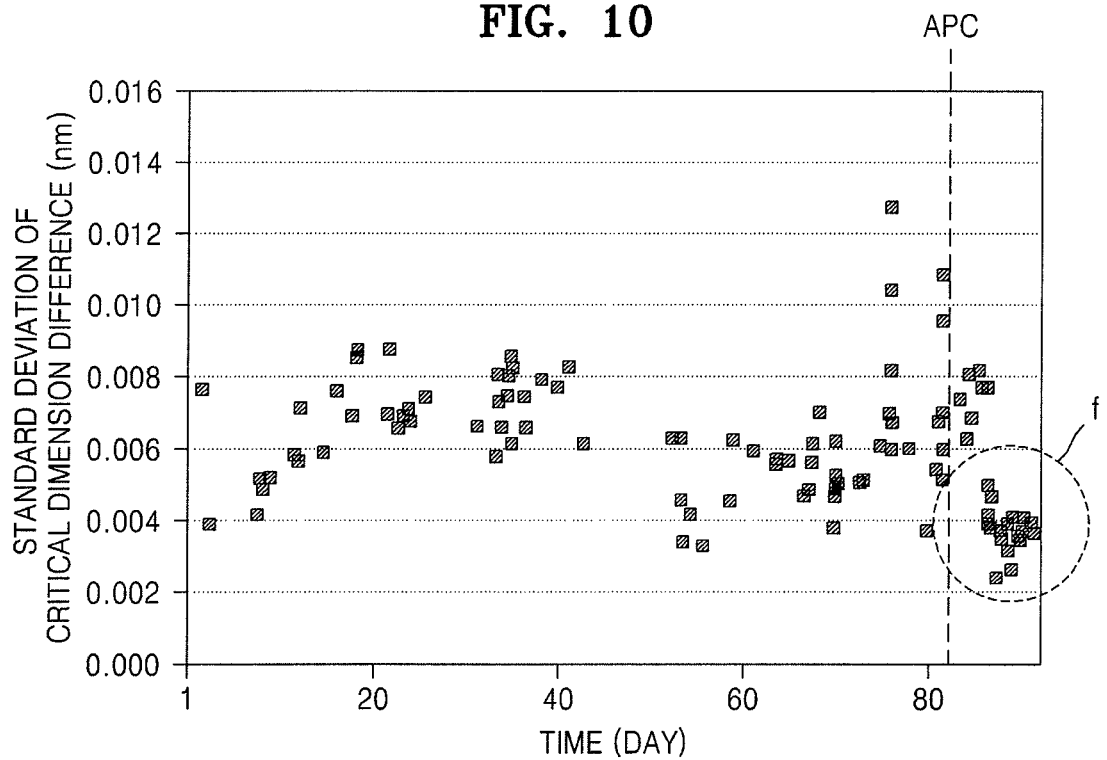
FIG. 10 is a graph illustrating the standard deviation of a critical dimension difference when a semiconductor process is performed using a method of controlling semiconductor process distribution, according to an exemplary embodiment of the inventive concept.

FIG. 10 is a graph illustrating the standard deviation of a critical dimension difference when a semiconductor process is performed using a method of controlling semiconductor process distribution according to an embodiment of the inventive concept.

For example, FIG. 10 is a graph illustrating semiconductor process distribution based on the standard deviation of a critical dimension difference when an etching process for forming a material layer pattern is performed by etching a material layer formed on a semiconductor wafer using the semiconductor wafer processing apparatus 540 illustrated in FIG. 1 (e.g., a semiconductor wafer etching apparatus). The X-axis represents time (e.g., a day). The Y-axis represents three times the standard deviation of a critical dimension difference between a material layer patterns of a central area and a corner area of a semiconductor wafer as described above.

As illustrated in FIG. 10, as the semiconductor wafer etching apparatus is used, the standard deviation of the critical dimension difference between the material layer patterns of the central area and the corner area of the semiconductor wafer increases. For example, as the semiconductor wafer etching apparatus is used, distribution regarding the standard deviation of the critical dimension difference between the material layer patterns of the central area and the corner area of the semiconductor wafer may not be acceptable.

However, when a semiconductor process is automatically adjusted using a method of controlling semiconductor process distribution after a time denoted by 'APC' in FIG. 10, distribution regarding the standard deviation of the critical dimension difference between the material layer patterns of the central area and the corner area of the semiconductor wafer is improved, as illustrated by 'f' of FIG. 10.

While the inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A method of controlling process distribution of a semiconductor process, comprising:
   receiving process distribution data representing the process distribution of the semiconductor process;
   receiving a parameter related to the process distribution, wherein the parameter is received from a semiconductor wafer processing apparatus and is received at a semiconductor process controlling apparatus;
   generating a virtual metrology model corresponding to the process distribution based on a relationship between the process distribution data and the parameter;
   selecting an optimized process variable affecting the process distribution from among a plurality of process variables;
   modifying the optimized process variable affecting the process distribution based on the virtual metrology model; and
   transmitting the optimized process variable from the semiconductor process controlling apparatus to the semiconductor wafer processing apparatus to adjust the process distribution of the semiconductor process in real-time while the semiconductor process is being performed.

2. The method of claim 1, wherein the parameter is received from at least one sensor of the semiconductor wafer processing apparatus configured to perform the semiconductor process.

3. The method of claim 1, wherein the parameter is an apparatus variable value set by a process controller of the semiconductor wafer processing apparatus configured to perform the semiconductor process.

4. The method of claim 1, wherein the virtual metrology model is generated based on a statistical analysis of the relationship between the process distribution data and the parameter, and the statistical analysis uses a partial least squares (PLS) technique.

5. The method of claim 1, further comprising:
   measuring process distribution of each of a plurality of semiconductor wafers processed during the semiconductor process;
   determining whether the process distribution of each semiconductor wafer is acceptable; and
   modifying the virtual metrology model upon determining that the process distribution of each semiconductor wafer is not acceptable.

6. The method of claim 1, further comprising:
   predicting process distribution of each of a plurality of semiconductor wafers processed during the semiconductor process using the virtual metrology model; and
   modifying the optimized process variable based on the predicted process distribution.

7. The method of claim 6, wherein the parameter is at least one of a value received from a sensor of the semiconductor wafer processing apparatus configured to perform the semiconductor process, or an apparatus variable value set by a process controller of the semiconductor wafer processing apparatus.

8. The method of claim 7, wherein the value received from the sensor of the semiconductor wafer processing apparatus is one of a temperature, a pressure, or an amount of a reactive gas.

9. The method of claim 7, wherein the apparatus variable value is one of an amount of a reactive gas, a power value, a temperature, or a pressure.

10. The method of claim 6, wherein predicting the process distribution of each semiconductor wafer is performed in real-time.

11. The method of claim 1, wherein the semiconductor process is one of a deposition process, an ion implantation process, a photolithography process, or an etching process.

12. The method of claim 1, wherein the optimized process variable is selected using the virtual metrology model.

13. A method of controlling process distribution of an etching process, comprising:

receiving process distribution data representing the process distribution of the etching process, wherein the etching process is performed on a semiconductor wafer by a semiconductor wafer etching apparatus;

receiving a parameter related to the process distribution, wherein the parameter is received from the semiconductor wafer etching apparatus and is received at a semiconductor process controlling apparatus;

generating a virtual metrology model corresponding to the process distribution of the etching process based on a relationship between the process distribution data and the parameter;

selecting an optimized process variable affecting the process distribution from among a plurality of process variables;

modifying the optimized process variable affecting the process distribution based on the virtual metrology model; and transmitting the optimized process variable from the semiconductor process controlling apparatus to the semiconductor wafer etching apparatus to adjust the process distribution of the etching process in real-time while the etching process is being performed.

14. The method of claim 13, wherein the parameter is at least one of a value received from a sensor of the semiconductor wafer etching apparatus, or an apparatus variable value set by a process controller of the semiconductor wafer etching apparatus.

15. The method of claim 14, wherein the value received from the sensor of the semiconductor wafer etching apparatus is one of a temperature, a pressure, or an amount of a reactive gas.

16. The method of claim 14, wherein the apparatus variable value is one of an amount of a reactive gas, a power value, a temperature, or a pressure.

17. The method of claim 13, further comprising:
forming a material layer pattern on the semiconductor wafer by etching a material layer formed on the semiconductor wafer,
wherein the process distribution data is based on at least one of a critical dimension difference between the material layer pattern of a central area and a corner area of the semiconductor wafer,
a range of the critical dimension difference between the material layer pattern of the central area and the corner area of the semiconductor wafer,
a standard deviation of the critical dimension difference between the material layer pattern of the central area and the corner area of the semiconductor wafer, or
a thickness difference between the material layer pattern of the central area and the corner area of the semiconductor wafer.

18. A system for controlling process distribution of a semiconductor process, comprising:
a semiconductor wafer processing apparatus configured to perform the semiconductor process; and
a semiconductor process controlling apparatus comprising an input circuit configured to receive process distribution data representing the process distribution of the semiconductor process and a parameter related to the process distribution, and a processor configured to generate a virtual metrology model corresponding to the process distribution based on a relationship between the process distribution data and the parameter, select an optimized process variable affecting the process distribution from among a plurality of process variables, modify the optimized process variable affecting the process distribution based on the virtual metrology model, and transmit the optimized process variable to the semiconductor wafer processing apparatus to adjust the process distribution of the semiconductor process in real-time while the semiconductor process is being performed.

19. The system of claim 18, further comprising:
a photosensor configured to detect light in a chamber of the semiconductor wafer processing apparatus, wherein the parameter is the amount of light detected by the photosensor.

20. The system of claim 18, further comprising:
a temperature sensor configured to detect a temperature of a chamber of the semiconductor wafer processing apparatus;
a pressure sensor configured to detect a pressure of the chamber; and
a gas analyzing sensor configured to analyze a reactive gas generated by the chamber,
wherein the parameter is one of the temperature of the chamber, the pressure of the chamber, or the reactive gas generated by the chamber.

21. The system of claim 18, wherein the semiconductor wafer processing apparatus further comprises a process controller configured to set an apparatus variable value, wherein the parameter is the apparatus variable value.

22. A method of controlling process distribution of a semiconductor process, comprising:
receiving process distribution data representing the process distribution of the semiconductor process;
receiving a first parameter related to the process distribution, wherein the first parameter is received at a semiconductor process controlling apparatus and received from a semiconductor wafer processing apparatus, and the first parameter is an optical emission spectroscopy (OES) variable representing light energy detected at the semiconductor wafer processing apparatus;
receiving a second parameter related to the process distribution, wherein the second parameter is received at the semiconductor process controlling apparatus and received from the semiconductor wafer processing apparatus, and the second parameter is an environmental variable representing a temperature of a chamber of the semiconductor wafer processing apparatus, a pressure of the chamber, or an amount of reactive gas generated by the chamber;
receiving a third parameter related to the process distribution, wherein the third parameter is received at the semiconductor process controlling apparatus and received from the semiconductor wafer processing apparatus, and the third parameter is an apparatus variable representing an amount of gas supplied to the chamber, a gas rate of the gas supplied to the chamber, an RF power value applied to a susceptor of the chamber, a temperature of a component of the chamber, or a pressure of the chamber;
generating a virtual metrology model corresponding to the process distribution based on a relationship between the process distribution data and the first, second and third parameters; and
modifying a process variable affecting the process distribution based on the virtual metrology model.

* * * * *